(12) United States Patent
Froehlich et al.

(10) Patent No.: US 10,972,059 B2
(45) Date of Patent: Apr. 6, 2021

(54) MEMS SENSOR

(71) Applicant: ams International AG, Rapperswil (CH)

(72) Inventors: Thomas Froehlich, Ottikon Bei Kemptthal (CH); Mark Niederberger, Einsiedeln (CH); Colin Steele, Edinburgh (GB); Rene Scheuner, Winterthur (CH); Thomas Christen, Zurich (CH); Lukas Perktold, Hinwil (CH); Duy-Dong Pham, Graz (AT)

(73) Assignee: AMS INTERNATIONAL AG, Rapperswil (CH)

( * ) Notice: Subject to any disclaimer, the term of this patent is extended or adjusted under 35 U.S.C. 154(b) by 0 days.

(21) Appl. No.: 16/463,465

(22) PCT Filed: Oct. 24, 2017

(86) PCT No.: PCT/EP2017/077127
§ 371 (c)(1),
(2) Date: May 23, 2019

(87) PCT Pub. No.: WO2018/099655
PCT Pub. Date: Jun. 7, 2018

(65) Prior Publication Data
US 2019/0356282 A1 Nov. 21, 2019

(30) Foreign Application Priority Data
Dec. 1, 2016 (EP) .................................. 16201746

(51) Int. Cl.
*H03F 3/45* (2006.01)
*H04R 3/00* (2006.01)
*H03F 3/181* (2006.01)

(52) U.S. Cl.
CPC ......... *H03F 3/181* (2013.01); *H03F 3/45941* (2013.01); *H04R 3/00* (2013.01);
(Continued)

(58) Field of Classification Search
None
See application file for complete search history.

(56) References Cited

U.S. PATENT DOCUMENTS 8,981,834 B2 3/2015 Spinella et al.
2008/0122457 A1 5/2008 Taguchi
(Continued)

FOREIGN PATENT DOCUMENTS

CN 102129145 7/2011
CN 106067823 11/2016

OTHER PUBLICATIONS

European Patent Office, International Search Report for PCT/EP2017/077127 dated Jan. 19, 2018.

*Primary Examiner* — Ping Lee
(74) *Attorney, Agent, or Firm* — MH2 Technology Law Group LLP

(57) ABSTRACT

A MEMS sensor (1) comprises a MEMS transducer (10) being coupled to a MEMS interface circuit (20). The MEMS interface circuit (20) comprises a bias voltage generator (100), a differential amplifier (200), a capacitor (300) and a feedback control circuit (400). The bias voltage generator (100) generates a bias voltage (Vbias) for operating the MEMS transducer. The variable capacitor (300) is connected to one of the input nodes (I200a) of the differential amplifier (200). At least one of the output nodes (A200a, A200b) of the differential amplifier is coupled to a base terminal (T110) of an output filter (110) of the bias voltage generator (100). Any disturbing signal from the bias voltage generator (100) is a common-mode signal that is divided (Continued)

equally on the input nodes (1200a, 1200b) of the differential amplifier (200) and is therefore rejected.

13 Claims, 8 Drawing Sheets

(52) U.S. Cl.
CPC .. *B81B 2201/0257* (2013.01); *H03F 2200/03* (2013.01); *H03F 2200/42* (2013.01); *H03F 2203/45512* (2013.01)

(56) References Cited

U.S. PATENT DOCUMENTS

| | | |
|---|---|---|
| 2013/0266156 A1 | 10/2013 | Fröhlich et al. |
| 2014/0376749 A1 | 12/2014 | Nielsen |
| 2015/0137834 A1 | 5/2015 | Steiner |

MEMS SENSOR

TECHNICAL FIELD

A MEMS (micro electro mechanical system) sensor comprising a MEMS transducer having a variable capacitor and a MEMS interface circuit being coupled to the MEMS transducer for amplifying an output signal of the MEMS transducer is disclosed.

BACKGROUND

A MEMS sensor is usually provided as a chip comprising a MEMS transducer and a MEMS interface circuit. The MEMS transducer can be configured as a MEMS microphone, wherein the variable capacitor of the MEMS microphone changes its capacitance in dependence on a sound pressure impacting on the microphone. The MEMS transducer is biased by a bias voltage that is provided by the MEMS interface circuit. The MEMS interface circuit comprises an amplifier to amplify an input signal provided by the MEMS transducer and generates an amplified output signal.

The MEMS transducer is usually configured as a single-ended device that is coupled to a front-end amplifier of the MEMS interface circuit. Because of the single-ended nature of this architecture, the PSRR (power supply rejection ratio), and the suppression of noise as well as the EMC (electromagnetic compatibility) interference from a terminal of the MEMS interface circuit where the bias voltage is applied to the MEMS transducer is rather poor. That means that the front-end amplifier of the MEMS interface circuit that receives an input signal from the MEMS transducer cannot really distinguish between a common-mode signal, for example caused by noise and interference, and an actual wanted signal, such as an audio signal of a MEMS microphone.

There is a desire to provide a micro electro mechanical system sensor comprising a MEMS transducer and a MEMS interface circuit, wherein the amplification of disturbing signals, such as a common-mode signal caused by noise and interference is prevented as far as possible.

SUMMARY

An embodiment of a micro electro mechanical system sensor, wherein the amplification of a common-mode signal occurring at an input side of a MEMS interface circuit due to any disturbance and noise from the bias voltage is suppressed, is specified in claim 1.

The micro electro mechanical system sensor comprises a micro electro mechanical system (MEMS) transducer and a micro electro mechanical system (MEMS) interface circuit. The micro electro mechanical system interface circuit has a first input terminal to provide a bias voltage for the micro electro mechanical system transducer and to receive a first input signal, and a second input terminal to receive a second input signal from the micro electro mechanical system transducer, and at least one output terminal to provide an output signal. The output signal is any representation of the input signal, for example an amplification of the input signal. The micro electro mechanical system transducer is coupled to the first and the second input terminal of the micro electro mechanical system interface circuit.

The micro electro mechanical system interface circuit comprises a bias voltage generator, a differential amplifier, a capacitor and a feedback control circuit. The capacitor may be configured as a variable capacitor having a variable capacitance. The bias voltage generator has an output node to provide the bias voltage, the output node being connected to the first input terminal of the micro electro mechanical system interface circuit.

The differential amplifier has a first input node and a second input node, the first input node being connected to the first input terminal via the capacitor, the second input node being connected to the second input terminal of the micro electro mechanical system interface circuit. The differential amplifier has at least one output node to provide an output signal, the at least one output node being connected to the at least one output terminal of the micro electro mechanical system interface circuit. The differential amplifier is configured to provide the output signal at the at least one output node of the differential amplifier.

The bias voltage generator comprises an output filter. The at least one output node of the differential amplifier is connected to a base terminal of the output filter of the bias voltage generator via the feedback control circuit. The feedback control circuit is configured to provide a feedback signal at the base terminal of the output filter of the bias voltage generator so that the voltage potential at the base terminal of the output filter is changed in the same way as the voltage potential at the output node of the bias voltage generator is changed.

The MEMS transducer is configured as a single-ended device, for example as a single-ended MEMS microphone. The MEMS interface circuit interfaces the single-ended transducer electronically in a differential manner. The variable capacitor of the MEMS interface circuit is a kind of replica capacitor being a replica of the variable capacitor of the MEMS transducer. That means that the capacitance of the capacitor of the MEMS interface circuit is (nearly) the same as the capacitance of the variable capacitor of the MEMS transducer. The variable capacitor of the MEMS transducer is connected to the first input node, for example a negative input node, of the differential amplifier. This means that a differential signal is established at the input side of the differential amplifier by feeding back the output signal of the differential amplifier over the bias voltage generator, for example a charge-pump DC biasing.

DETAILED DESCRIPTION

The proposed MEMS sensor will now be described in more detail hereinafter with reference to the accompanying drawings showing different embodiments of the MEMS sensor. The MEMS sensor may, however, be embodied in many different forms and should not be construed as limited to the embodiments set forth herein; rather, these embodiments are provided so that the disclosure will fully convey the scope of the MEMS sensor to those skilled in the art.

Figure 1:
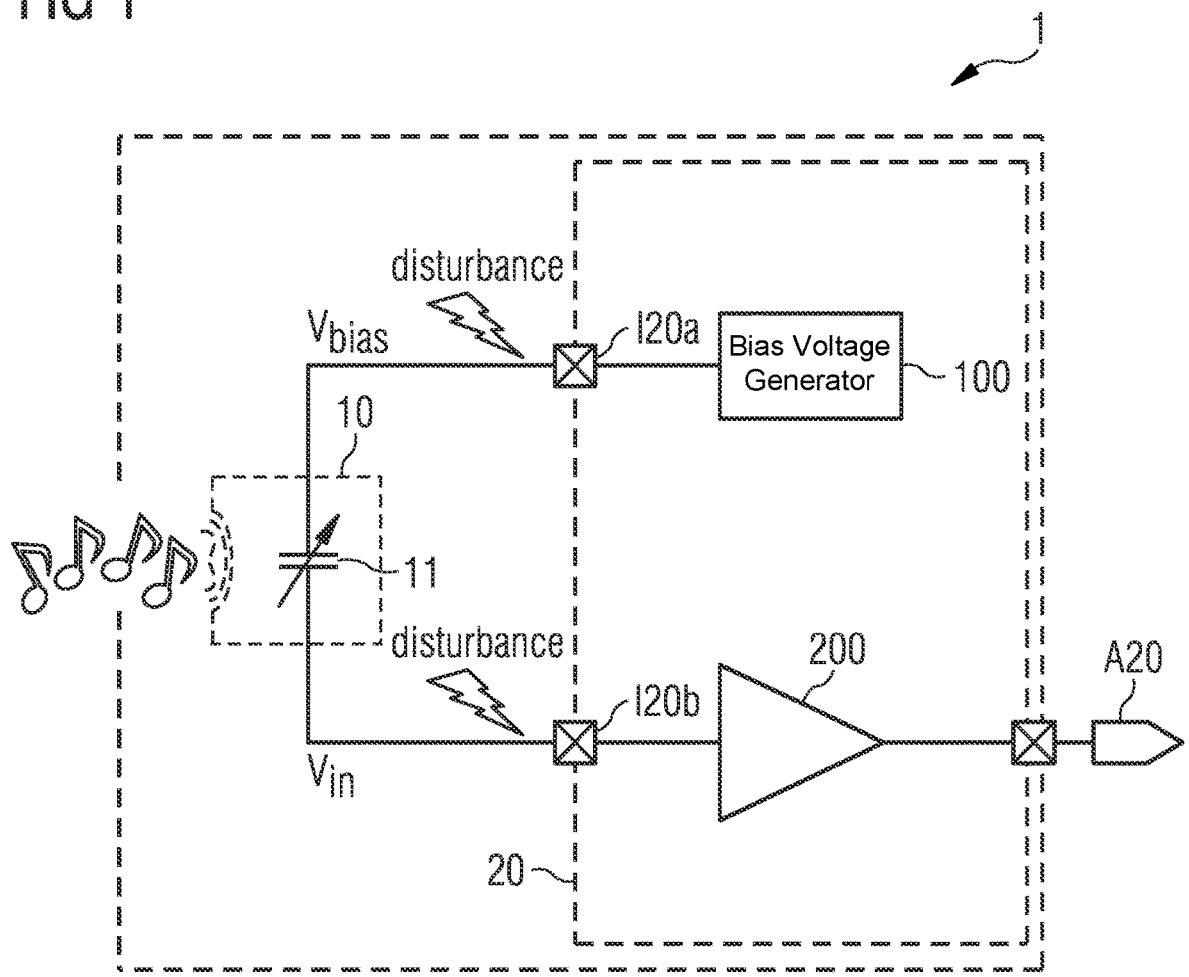
FIG. 1 shows a MEMS sensor system block diagram comprising a MEMS transducer and a MEMS interface circuit in a single-ended configuration.

FIG. 1 shows a MEMS sensor 1 comprising a MEMS transducer 10 and a MEMS interface circuit 20. The MEMS transducer 10 and the MEMS interface circuit 20 may be housed in a common casing of the MEMS sensor 1. The MEMS transducer 10 may be configured as a MEMS microphone. The MEMS interface circuit 20 comprises a bias voltage generator 100 to provide a bias voltage Vbias at an input terminal I20a of the MEMS interface circuit 20. The bias voltage generator 100 may be configured as a charge-pump with an output filter. The MEMS interface circuit 20 comprises a further input terminal I20b to apply an input signal Vin of the MEMS transducer 10 to the MEMS interface circuit 20. The input signal Vin received by the MEMS interface circuit 20 from the MEMS transducer 10 is amplified by a front-end charge amplifier 200 that generates an amplified output signal at an output terminal A20 of the MEMS interface circuit 20. The MEMS interface circuit 20 can either have an analog output, or a digital output, i.e. the front-end charge amplifier 200 is driving an analog-to-digital converter.

The MEMS transducer 10 can be modelled as a variable capacitor 11 having a variable capacitance ΔC(t) that changes its capacitance depending on a sound pressure that impacts on a membrane of the variable capacitor 11. In order to generate the input signal Vin at the input terminal of the MEMS interface circuit 20, the MEMS transducer 10 is biased with the DC biasing voltage Vbias generated by the bias voltage generator 100 of the MEMS interface circuit 20. Because the front-end amplifier input impedance is large, any charge on the variable capacitor 11 is preserved ($Q_{const}$) and the input voltage Vin changes linearly with the sound pressure as explained by the equation below.

$$V_{in}(t) = \frac{1}{\Delta C(t)} Q_{const} = \frac{d(t)}{\varepsilon} Q_{const}$$

Because of the single-ended nature of the MEMS sensor 1 shown in FIG. 1, the PSRR, and the suppression of noise and (EMC) interference from the input terminal I20a to apply the bias voltage Vbias is low. In particular, the front-end amplifier 200 cannot distinguish between a common-mode signal, for example noise and interference, and the actual wanted signal of the MEMS transducer 10, for example an audio signal of a MEMS microphone that is applied to the input terminal I20b of the MEMS interface circuit. Furthermore, any disturbance and noise from the input node I20a to apply the bias voltage Vbias directly couples to the input terminal I20b of the MEMS interface circuit and thus on the input side of the front-end amplifier 200.

Figure 2:
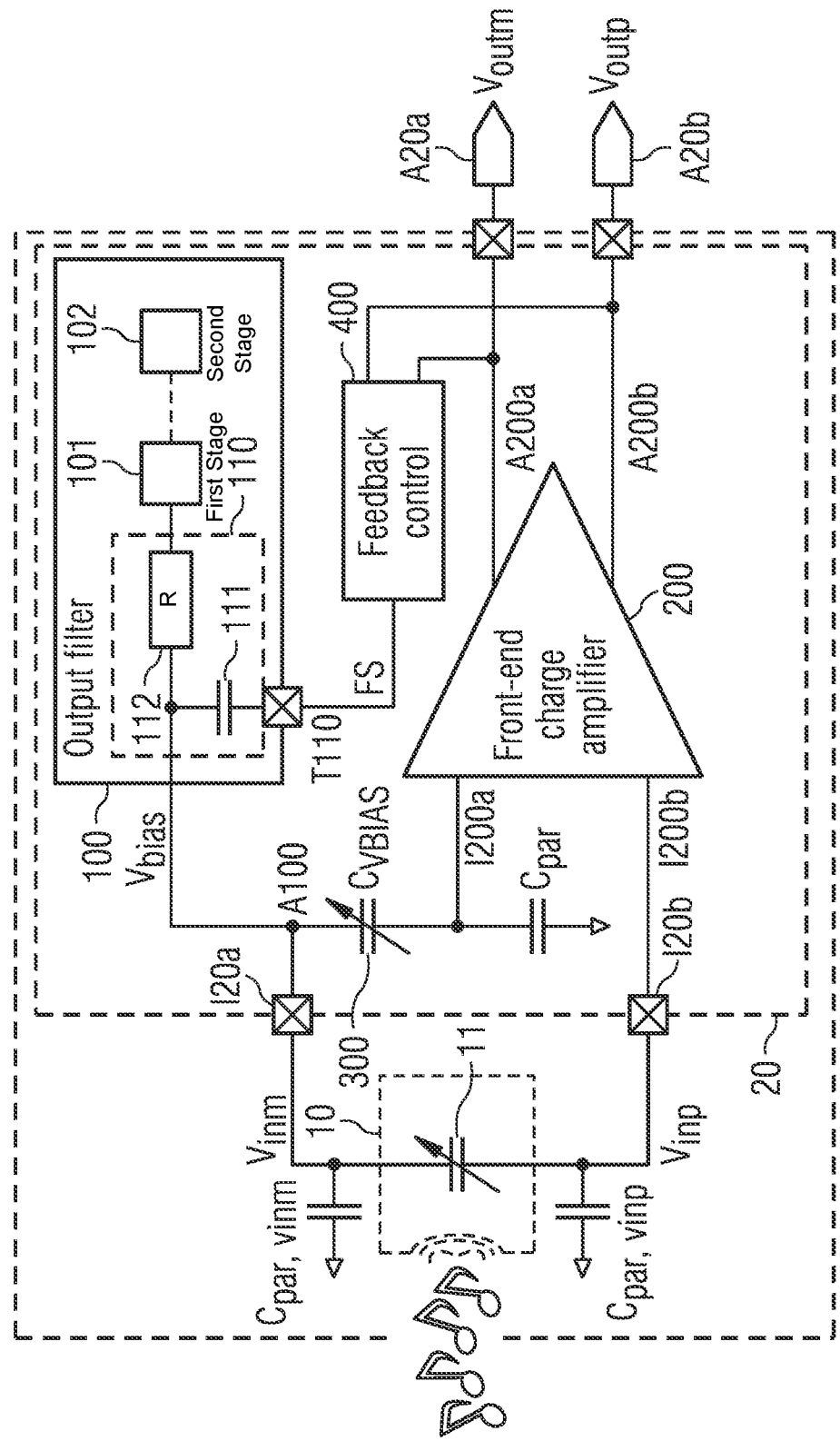
FIG. 2 shows a generic block diagram of an embodiment of a MEMS sensor comprising a MEMS interface circuit that interfaces a single-ended MEMS transducer electronically in a differential manner.

FIG. 2 shows a generic block diagram of an embodiment of a MEMS sensor 1 comprising a MEMS transducer 10 and a MEMS interface circuit 20. The MEMS interface circuit 20 interfaces the single-ended MEMS transducer 10 electronically in a differential manner.

The MEMS interface circuit 20 has an input terminal I20a to provide the bias voltage Vbias for the MEMS transducer 10 and to receive a first input signal Vinm from the MEMS transducer 10. The MEMS interface circuit 20 further comprises an input terminal I20b to receive a second input signal Vinp from the MEMS transducer 10. The MEMS transducer 10 is coupled to the first and the second input terminal I20a, I20b of the MEMS interface circuit 20. The MEMS interface circuit 20 further comprises at least one output terminal A20a, A20b to provide an output signal Voutm and/or Voutp, wherein the output signal is a representation of the input signals, for example an amplified signal representing the difference of the input signals. The MEMS interface circuit may comprise a first and a second output terminal A20a, A20b to provide a differential output signal.

The MEMS interface circuit 20 comprises a bias voltage generator 100, a differential amplifier 200, a capacitor 300 and a feedback control circuit 400. The capacitor 300 shown in the embodiment of FIG. 2 and in the embodiments of the FIGS. 3 to 8 may be configured as a variable capacitor having a variable capacitance. The bias voltage generator 100 has an output node A100 to provide the bias voltage Vbias. The output node A100 is connected to the first input terminal I20a of the MEMS interface circuit 20. The bias voltage generator 100 may comprise at least one stage 101, 102 that is coupled via an output filter 110 of the bias voltage generator 100 to the output terminal A100. The output filter 110 may comprise a filter capacitor 111 and a resistor 112.

The differential amplifier 200 has a first input node I200a and a second input node I200b. The first input node I200a is connected to the first input terminal I20a of the MEMS interface circuit 20 via the variable capacitor 300. The second input node I200b of the differential amplifier 200 is connected to the second input terminal I20b of the MEMS interface circuit 20. The differential amplifier 200 has at least one output node A200a, A200b to provide an output signal. The at least one output node A200a, A200b may be connected to the at least one output terminal A20a, A20b of the micro electro mechanical system interface circuit 20.

According to a possible embodiment shown in FIG. 2, the differential amplifier 200 has a first output node A200a to provide a first output signal Voutm and a second output node A200b to provide a second output signal Voutp. The first output node A200a of the differential amplifier is connected to a first output terminal A20a of the MEMS interface circuit 20, and the second output node A200b of the differential amplifier is connected to a second output terminal A20b of the MEMS interface circuit 20. The first and the second output signals Voutm and Voutp represent a differential output signal.

According to an embodiment of the MEMS sensor 1, one of the first and the second input node I200a, I200b of the differential amplifier 200 is a non-inverting input node, and the other one of the first and the second input node I200a, I200b of the differential amplifier 200 is an inverting input node. According to the embodiment of the MEMS sensor 1 shown in FIG. 2, the first input node I200a of the differential amplifier 200 is an inverting input node and the second input node I200b of a differential amplifier 200 is a non-inverting input node.

The differential amplifier 200 may be configured as a single-ended output amplifier having single-ended output nodes or as an amplifier having digital output nodes. According to another embodiment shown in FIG. 2, one of the first and the second output node A200a, A200b of the differential amplifier is an inverting output node and provides an inverted signal. The other one of the first and second output nodes A200a, A200b of the differential amplifier 200 is a non-inverting node and provides a non-inverted signal. According to the embodiment of the MEMS sensor 1 shown in FIG. 2, the first output node A200a of the differential amplifier 200 is an inverting node and generates the inverted output signal Voutm. The second output node A200b is a non-inverting node and generates the non-inverted signal Voutp.

The at least one output node of the differential amplifier 200 is connected to a base terminal T110 of the output filter. According to the embodiment shown in FIG. 2, at least one of the first and the second output nodes A200a, A200b of the differential amplifier 200 is connected to the base terminal T110 of the output filter 110 of the bias voltage generator 100 via the feedback control circuit 400. FIG. 2 shows an embodiment, wherein both of the output nodes A200a and A200b are connected to the base terminal T110 via the feedback control circuit 400. According to another embodiment not shown in FIG. 2 only one of the first and second output node A200a and A200b is connected to the base terminal T110 of the output filter 110 via the feedback control circuit 400.

The feedback control circuit 400 is configured to provide a feedback signal FS at the base terminal T110 of the output filter 110 so that the voltage potential at the base terminal T110 of the output filter 110 is changed in the same way as the voltage potential at the output node A100 of the bias voltage generator 100 is changed. The feedback control circuit could be a digital signal path with DAC plus buffer at the end (in case the amplifier is connected to an ADC). Signal gain and filtering could be done in digital domain (better suited in case it has to be adaptive).

According to an embodiment of the MEMS sensor 1, the feedback control circuit 400 is configured to provide the feedback signal FS at the base terminal T110 of the output filter 100 of the bias voltage generator 110 so that the voltage potential at the base terminal T110 of the output filter 110 is equal to or at least in the range of the voltage potential at the output node A100 of the bias voltage generator 100.

According to an embodiment of the MEMS sensor 1, the capacitor 300 has a capacitance that is adjusted such that the capacitance of the variable capacitor 300 is equal to or at least in the range of the capacitance of the variable capacitor 11 of the MEMS transducer 10 measured between the first input terminal I20a and the second input terminal I20b of the MEMS interface circuit 20, when no acoustical signal is applied to the MEMS transducer 10.

According to the principle of the MEMS sensor 1 of FIG. 2, the at least one output signal, for example the first and the second output signal Voutm, Voutp, is fed back via the feedback control circuit 400 so that it cancels half of the signal from the MEMS transducer. Additionally, the on-chip variable capacitor 300 is added, which is tuned so that it matches the capacitance from the MEMS transducer. Consequently, the signal is divided equally on the positive and negative inputs of the differential charge amplifier 200, resulting electronically in a fully differential system.

FIG. 2 shows parasitic capacitances $C_{par,vinm}$ and $C_{par,vinp}$ of the MEMS transducer 10 as well as a parasitic capacitance $C_{par}$ of the MEMS interface circuit 200. The parasitic capacitance $C_{par,vinm}$ is located between the first input terminal I20a and a ground potential. The parasitic capacitance $C_{par,vinp}$ is located between the input terminal I20b and the ground potential. The parasitic capacitance $C_{par}$ is located between the first input node I200a of the differential amplifier 200 and the ground potential. The parasitic capacitance $C_{par}$ can be configured as a variable capacitance. The capacitance $C_{Vbias}$ of the variable capacitor 300 is adjusted such that the capacitance measured between the output terminal A100 of the bias voltage generator 100/the input terminal I20a and the second input terminal I20b/the second input node I200b of the differential amplifier 200 is the same as the capacitance measured between the output node A100 of the bias voltage generator 100 and the first input node I200a of the differential amplifier 200.

Figure 3:
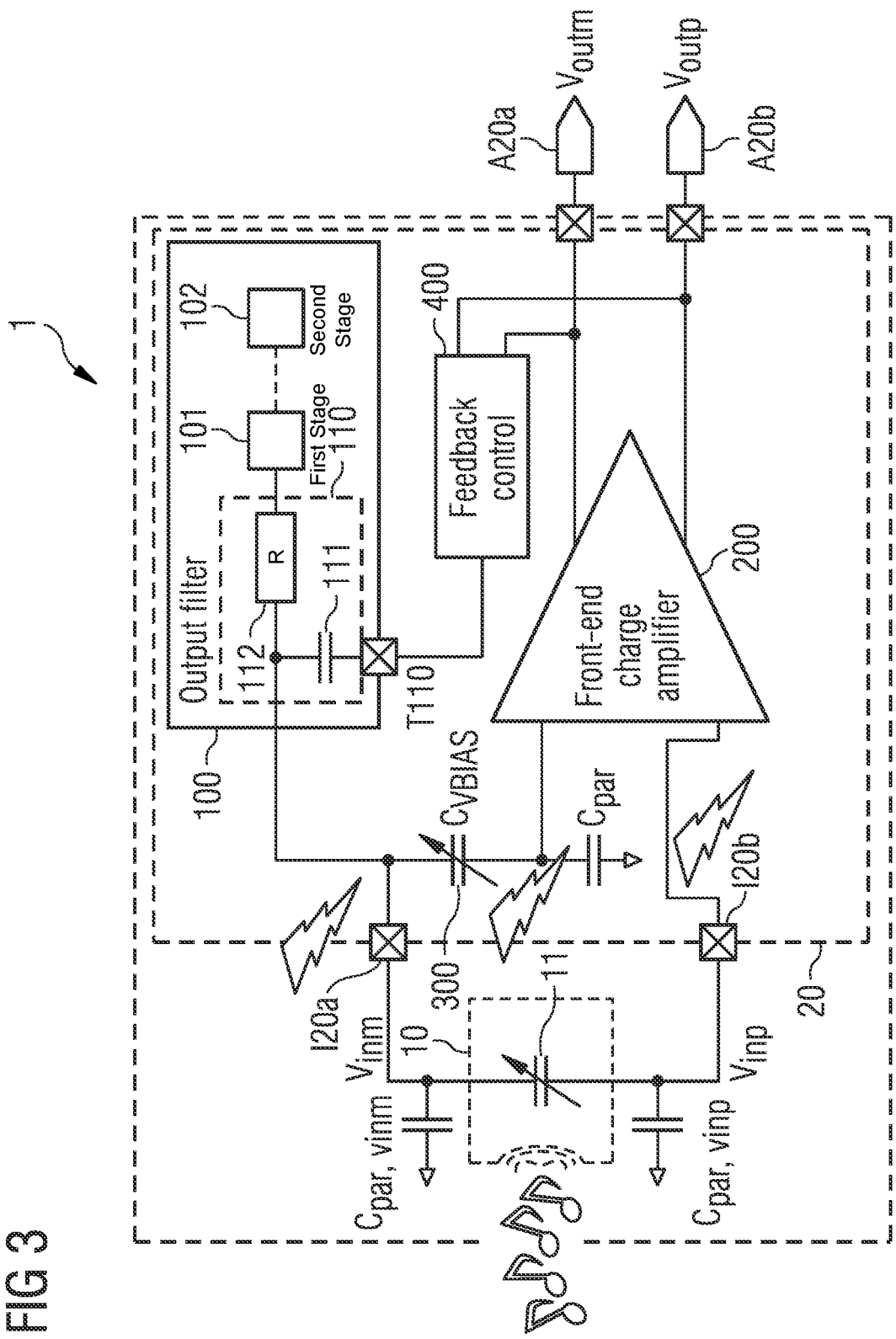
FIG. 3 illustrates the occurrence of a disturbing common-mode signal at an input terminal of the MEMS transducer to apply a bias voltage.

FIG. 3 illustrates the advantages of the proposed system. Any disturbances from the bias voltage generator 110 that may be configured as a charge-pump are common-mode and are therefore rejected by the matching between the capacitance of the variable capacitor 11 and the parasitic capacitances of the MEMS transducer 10 and the capacitance $C_{Vbias}$ and the parasitic capacitance of the variable (on-chip) capacitor 300 of the MEMS interface circuit 20.

The feedback path between one of the output nodes A200a, A200b of the differential amplifier 200 and the base terminal T110 of the output filter 110 enables that the output node A100 of the bias voltage generator 100 is a high resistive node so that a disturbing signal, for example a common-mode disturbing signal, is symmetrically applied to the first input node I200a and the second input node I200b of the differential amplifier 200. Since the portion of the disturbing/common-mode signal at the first and second input node I200a, I200b of the differential amplifier 200 is the same, the circuit configuration shown in FIG. 2 allows to compensate the disturbing common-mode signal.

There are different solutions possible to implement the feedback control circuit 400 in the feedback path so that an input signal is symmetrically divided to the first and second node I200a, I200b of the differential charge amplifier 200. FIGS. 4 to 7 illustrate the MEMS sensor 1 with different embodiments of the feedback control circuit 400.

Figure 4:
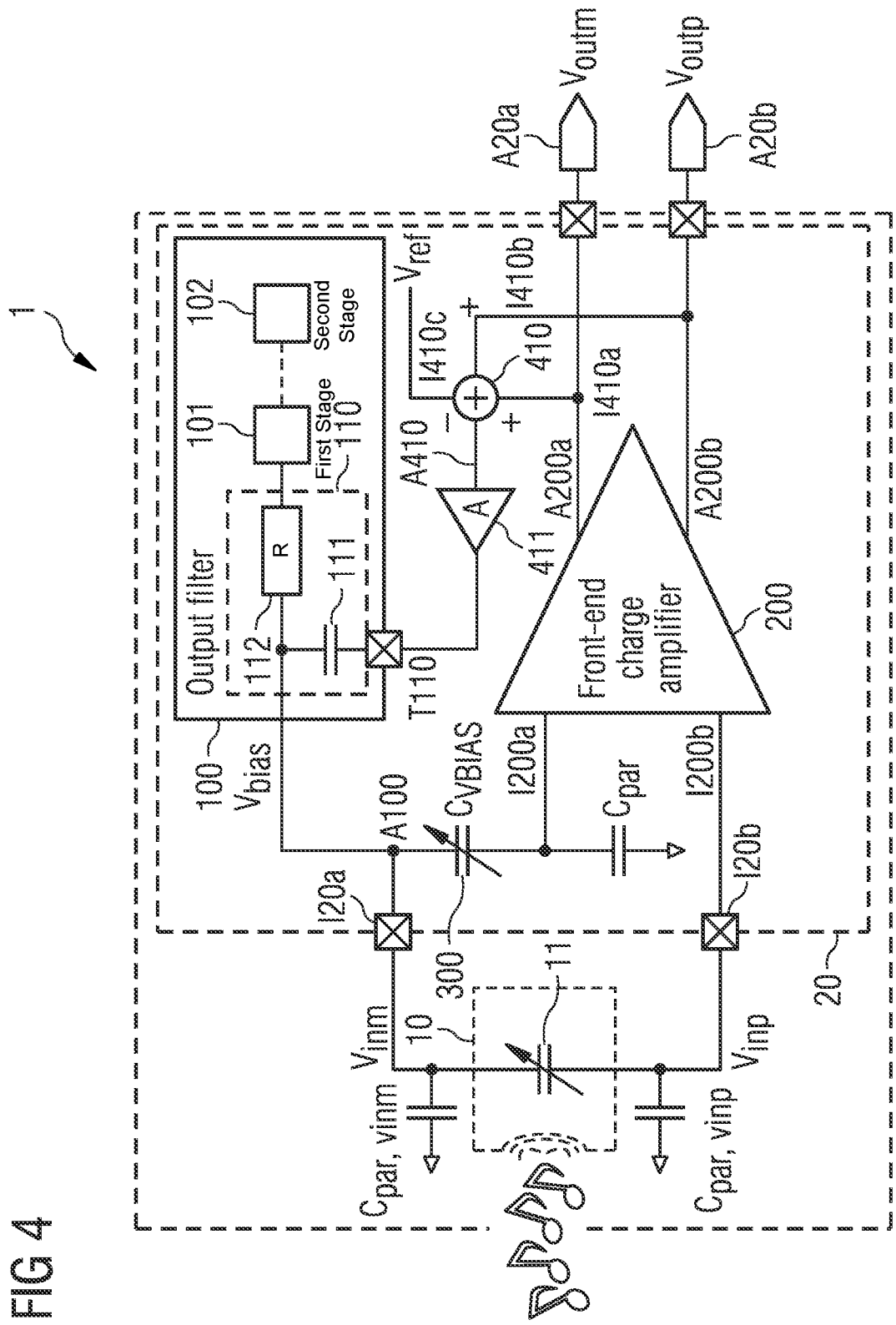
FIG. 4 shows a first embodiment of a MEMS sensor comprising a MEMS transducer and a MEMS interface circuit having a feedback control circuit, where the feedback information is obtained from a common-mode output signal of a differential amplifier of the MEMS interface circuit.

According to the embodiment of the MEMS sensor 1 shown in FIG. 4, the feedback control circuit 400 comprises a signal adder 410 having a first input node I410a being connected to the first output node A200a of the differential amplifier, and a second input node I410b being connected to the second output node A200b of the differential amplifier. The output node A410 of the signal adder 410 is coupled to the base terminal T110 of the output filter 110 of the bias voltage generator 100. As shown in FIG. 4, the feedback control circuit 400 may comprise an amplifier 411 being arranged between the output node A410 of the signal adder 410 and the base terminal T110 of the output filter 110 of the bias voltage generator 110.

The signal adder 410 is configured to add the first and the second output signal Voutm, Voutp of the differential amplifier 200 and to provide a common-mode signal at the output node A410 of the signal adder 410 in dependence on the sum of the first and the second output signal Voutm, Voutp.

According to a further embodiment the signal adder 410 of the feedback control circuit 400 has a third input node I410c to apply a reference signal Vref. The signal adder 410 is configured to provide the common-mode signal at the output node A410 of the signal adder 410 in dependence on the difference of the reference signal Vref from the sum of the first and the second output signal Voutm, Voutp of the differential amplifier 200.

According to the embodiment of the MEMS sensor 1 shown in FIG. 4, the feedback information is obtained from the common-mode output voltage of the differential amplifier 200. If the input nodes I200a, I200b of the differential amplifier 200 are equally divided, the output common-mode signal will not contain wanted signal information from the MEMS transducer. The circuit architecture shown in FIG. 4, therefore allows to observe the output common-mode voltage and feeds it back so that the residual signal on the common-mode voltage is minimized.

Figure 5:
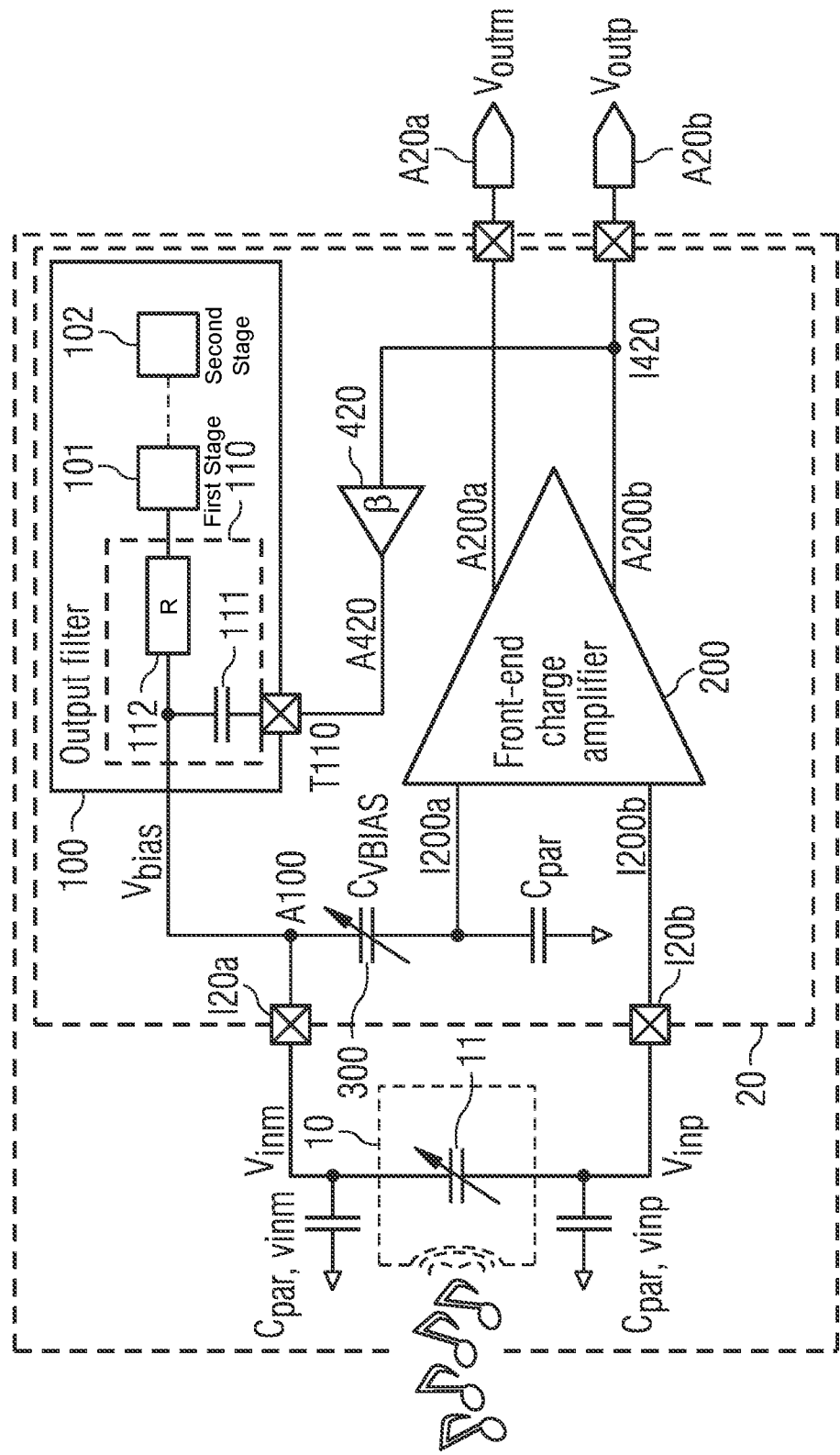
FIG. 5 shows a second embodiment of a MEMS sensor comprising a MEMS interface circuit where a feedback signal is obtained from an output signal of a differential amplifier of the MEMS interface circuit.
Figure 6:
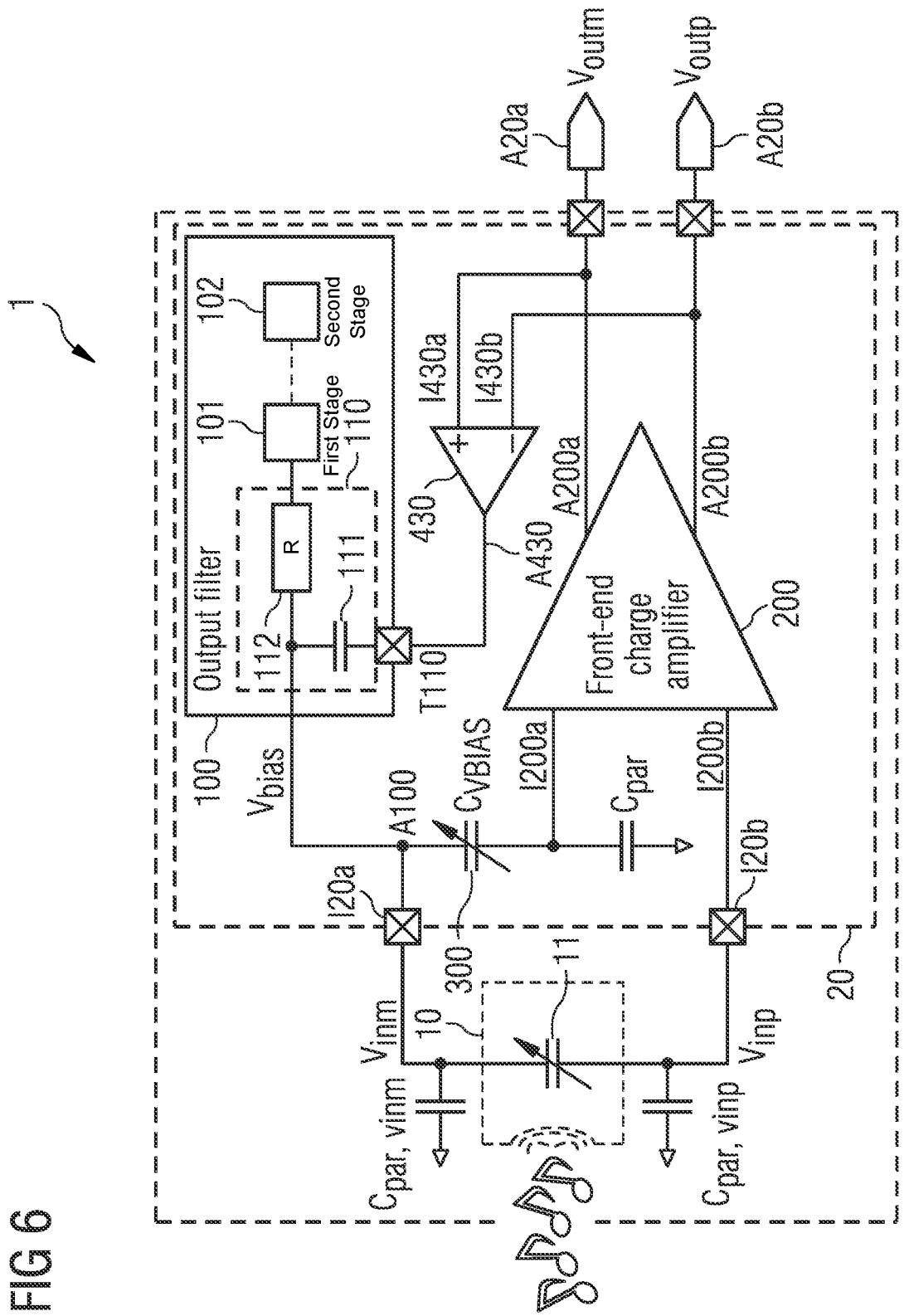
FIG. 6 shows a third embodiment of a MEMS sensor comprising a MEMS interface circuit where a differential output signal is fed back by a feedback control circuit of the MEMS interface circuit.
Figure 7:
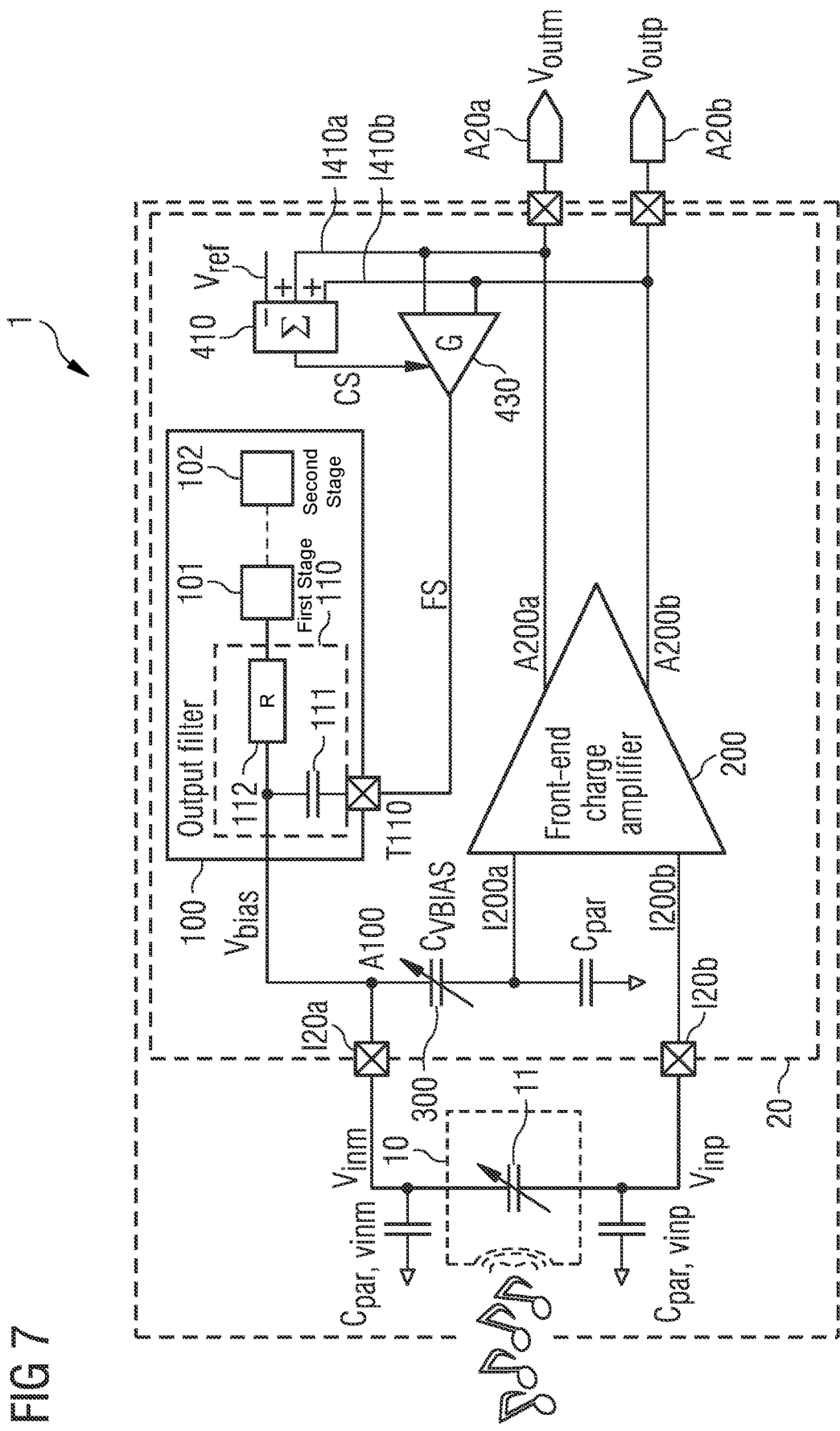
FIG. 7 shows a fourth embodiment of a MEMS sensor comprising a MEMS interface circuit with a gain tuning of an amplifier of a feedback control circuit of the MEMS interface circuit.
Figure 8:
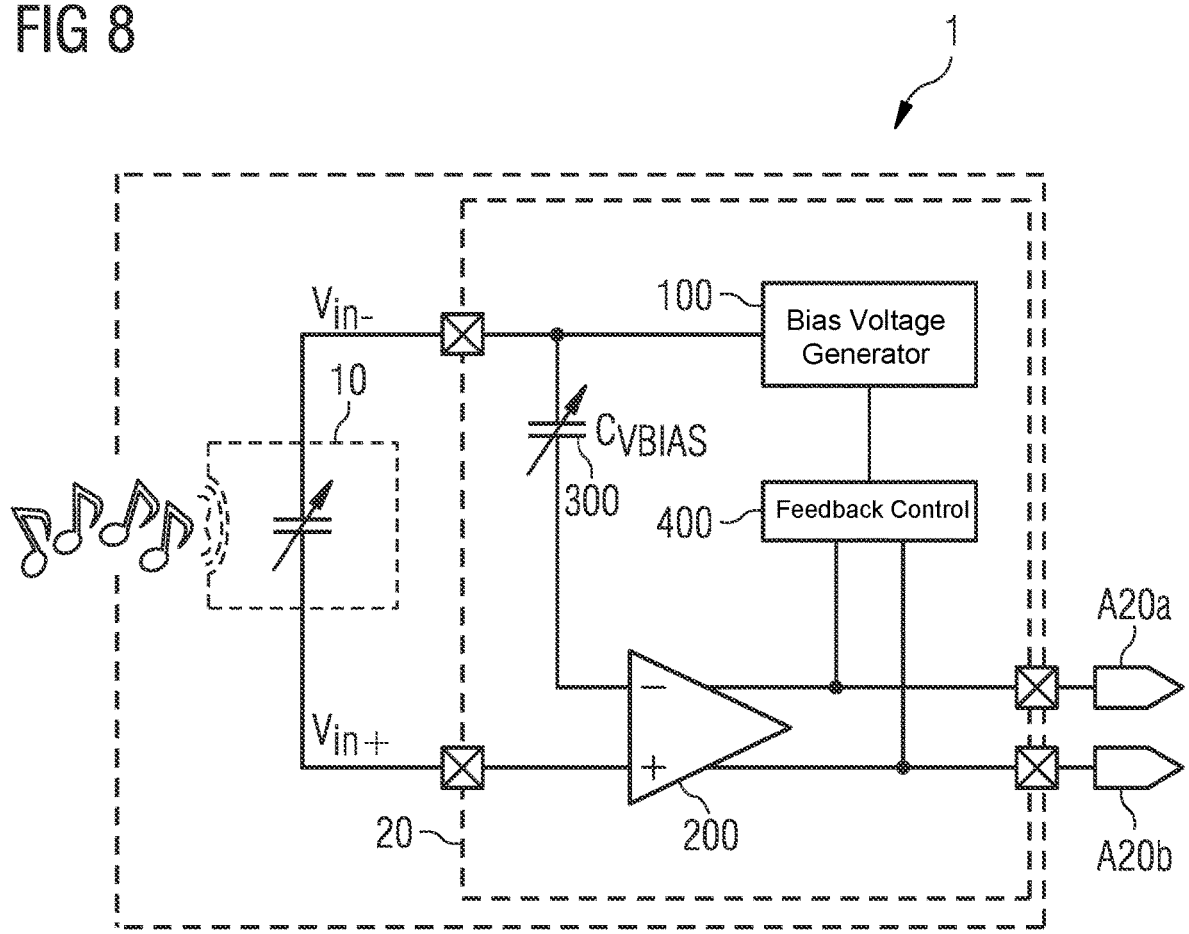
FIG. 8 illustrates a generic block diagram of an embodiment of a MEMS sensor based on moving/boot-strapping the entire charge pump/voltage generator with a feedback signal of the feedback path.

The following FIGS. 5 to 7 show other embodiments of the MEMS sensor 1, wherein not the common-mode error is fed back via the feedback path/the feedback control circuit to the base terminal T110 of the output filter 110, but the actual output signal. The feedback signal FS needs to be inverted in comparison to the signal from the MEMS transducer. This can be realized by either inverting the positive output signal Voutp, as shown for the embodiment of the MEMS sensor of FIG. 5, or by implementing differential-to-single-ended conversion using the differential output voltage Voutm, Voutp, as shown for the embodiments in FIGS. 6 and 7.

According to the embodiment of the MEMS sensor 1 shown in FIG. 5, the feedback control circuit 400 comprises a buffer circuit 420 having an input node I420 and an output node A420. The input node I420 of the amplifier 420 can be connected to the at least one output node of the differential amplifier. The input node I420a can, for example, be connected to one of the first and second output nodes A200a, A200b of the differential amplifier 200. The output node A420 of the amplifier 420 is connected to the base terminal T110 of the output filter 110 of the bias voltage generator 100.

The gain β of the buffer circuit 420 of the feedback control circuit 400 is dependent on the capacitive divider between the first input terminal I20a of the MEMS interface circuit 20 and the first input node I200a of the differential amplifier 200. The gain β of the buffer circuit 420 may be dependent on the capacitance measured between the first input terminal I20a of the MEMS interface circuit 20 and the first input node I200a of the differential amplifier 200. That means that the gain β of the buffer circuit 420 is dependent on the capacitance of the variable capacitor 300. The gain β of the buffer circuit 420 may be dependent on the capacitance of the variable capacitor 300 and the parasitic capacitance $C_{par}$. In particular, the gain of the buffer circuit 420 is set such that the voltage potential at the base terminal T110 of the output filter 110 of the bias voltage generator 100 is equal to the voltage potential at the output node A100 of the bias voltage generator 100. The gain of the buffer circuit 420 may be set to −β, for example to "−1", for inverting the positive output signal Voutp.

The MEMS sensor 1 shown in FIG. 5 might also work without a buffer circuit 420 in the feedback path, i.e. rather by directly connecting the first output node A200a of the differential amplifier that generates the inverted output signal Voutm to the base terminal T110 of the output filter 110. Nevertheless, the charge-amplifier 200 is often implemented as a pseudo-differential structure. The feedback buffer 420 is needed in this case to ensure proper start-up of the circuit.

According to the embodiment of the MEMS sensor 1 shown in FIG. 6, the feedback control circuit 400 comprises a differential-to-single-ended amplifier 430 having a first input node I430a coupled to the first output node A200a of the differential amplifier 200, and having a second input node I430b coupled to the second output node A200b of the differential amplifier 200. The differential-to-single-ended amplifier 430 has an output node A430 being coupled to the base terminal T110 of the output filter 110. The gain of the amplifier 430 may be "0.5".

The buffer circuit 420 ideally has unity gain for the implementation of the MEMS sensor shown in FIG. 5. Nevertheless, the gain of the buffer circuit 420, as well as the gain of the differential-to-single-ended amplifier 430, has to be well-matched also considering any attenuation due to parasitic capacitances, in order to equally divide the input signals to the first and the second input nodes I200a, I200b of the differential amplifier 200. This is in contrast to the proposed architecture of the MEMS sensor 1 shown in FIG. 4, where a correct loop gain is always ensured.

FIG. 7 shows an embodiment of a MEMS sensor 1 comprising a feedback control circuit that uses the amplifier common-mode information to tune the gain in the feedback path. According to the embodiment of the MEMS sensor 1 shown in FIG. 7, the differential-to-single-ended amplifier 430 has a variable gain. The gain is set such that the differential-to-single-ended amplifier 430 generates the feedback signal FS at the base terminal T110 of the output filter 110 of the bias voltage generator 100 so that the voltage potential at the base terminal T110 of the output filter 110 of the bias voltage generator 100 is equal to or at least in the range of the voltage potential at the output node A100 of the bias voltage generator 100.

The feedback control circuit 400 comprises a signal adder 410 having a first input node I410a and a second input node I410b. The first input node I410a of the signal adder 410 is coupled to the first output node A200a of the differential amplifier 200. The second input node I410b of the signal adder 410 is coupled to the second output node A200b of the differential amplifier 200. The signal adder 410 generates a control signal CS to set the gain of the differential-to-single-ended amplifier 430 in dependence on the sum of the first and the second output signal Voutm, Voutp of the differential amplifier 200.

As illustrated in FIG. 7, the amplifier common-mode information is used to tune the gain of the differential-to-single-ended amplifier 430 of the feedback control circuit 400. Instead of the common-mode signals, also other test-signals or calibration techniques could be used to properly tune the gain either at the start-up or in the background during operation of the MEMS sensor.

It should be noted that also combinations of the implementation examples shown in FIGS. 4 to 7 are possible, for example using both signal and common-mode information in the feedback path.

As explained above, the bias voltage generator 100 may be configured as a charge pump. The charge pump 100 may have a first stage 101 and at least a second stage 102. The output filter 110 may comprise a filter capacitor 111 and a resistor 112. Considering the charge-pump bootstrapping, different implementations are possible.

As shown for the exemplified implementations illustrated in FIGS. 4 to 7, the output node of the feedback control circuit 400 may be connected to the base terminal T110 of the output filter 110.

According to a first possible implementation, the base terminal T110 is only connected to the filter capacitor 111 of the output filter 110 of the bias voltage generator 100. That means that the feedback path is realized only via the capacitor 111 of the output filter 110 of the bias voltage generator 100.

According to another possible implementation, moving/bootstrapping the entire charge-pump with the feedback signal is possible. This kind of implementation is shown in the generic block diagram of the MEMS sensor 1 shown in FIG. 8.

According to other possible implementations, different coupling possibilities of the filter capacitor 111 to the stages of the charge-pump 100 are possible. That means that a single, several or all stages 101, 102 of the charge-pump may be connected to the base terminal T110 of the filter capacitor 111.

LIST OF REFERENCE SIGNS

1 MEMS sensor
10 MEMS transducer
20 MEMS interface circuit
100 bias voltage generator/charge-pump
110 output filter
200 differential amplifier
300 variable capacitor
400 feedback control circuit
410 signal adder
420 buffer circuit
430 differential-to-single-ended amplifier

The invention claimed is:

1. A micro electro mechanical system sensor, comprising:
a micro electro mechanical system transducer,
a micro electro mechanical system interface circuit comprising:
a first input terminal configured to provide a bias voltage for the micro electro mechanical system transducer and configured to receive a first input signal,
a second input terminal configured to receive a second input signal from the micro electro mechanical system transducer, and
at least one output terminal configured to provide at least one output signal, wherein the at least one output signal is a representation of the first and the second input signals,
wherein the micro electro mechanical system transducer is coupled between the first and the second input terminals of the micro electro mechanical system interface circuit,
wherein the micro electro mechanical system interface circuit comprises a bias voltage generator, a differential amplifier, a variable capacitor having a variable capacitance and a feedback control circuit,
wherein the bias voltage generator comprises an output node configured to provide the bias voltage, the output node being connected to the first input terminal of the micro electro mechanical system interface circuit,
wherein the differential amplifier comprises a first input node and a second input node, the first input node being connected to the first input terminal via the variable capacitor, the second input node being connected to the second input terminal of the micro electro mechanical system interface circuit,
wherein the differential amplifier comprises at least one output node configured to provide the at least one output signal, the at least one output node being connected to the at least one output terminal of the micro electro mechanical system interface circuit,
wherein the differential amplifier is configured to provide the at least one output signal at the at least one output node of the differential amplifier,
wherein the bias voltage generator comprises an output filter having a base terminal, the output filter comprising a capacitor being connected between the base terminal and the output node,
wherein the at least one output node of the differential amplifier is connected to the base terminal of the output filter of the bias voltage generator via the feedback control circuit,
wherein the feedback control circuit is configured to provide a feedback signal at the base terminal of the output filter of the bias voltage generator so that the voltage potential at the base terminal of the output filter is changed in the same way as the voltage potential at the output node of the bias voltage generator is changed,
wherein the first input node of the differential amplifier is configured to be driven only by the bias voltage of the bias voltage generator and the first input signal which is present at the first input terminal,
wherein the second input node of the differential amplifier is configured to be driven only by the second input signal which is present at the second input terminal, and
wherein a capacitance of the variable capacitor is configured to be adjusted in dependence on a capacitance of the transducer such that a ratio of the capacitance of the variable capacitor and a parasitic capacitance located at the first input node matches a ratio of the capacitance of the transducer and a parasitic capacitance located at the second input node of the differential amplifier such that any disturbing signal at the output node of the bias voltage generator is symmetrically applied to the first input node and the second input node of the differential amplifier.

2. The micro electro mechanical system sensor of claim 1,
wherein the feedback control circuit is configured to provide the feedback control signal at the base terminal of the output filter of the bias voltage generator so that the voltage potential at the base terminal of the output filter of the bias voltage generator is in a range of the voltage potential at the output node of the bias voltage generator.

3. The micro electro mechanical system microphone sensor of claim 1,
wherein the bias voltage generator is configured as a charge pump having a first stage and at least a second stage, and
wherein at least one of the first stage and the at least one of the second stage of the charge pump is connected to the base terminal of the output filter.

4. The micro electro mechanical system microphone sensor of claim 1,
wherein one of the first and the second input node of the differential amplifier is an inverting input node and the other one of the first and second input node of the differential amplifier is a non-inverting input node.

5. The micro electro mechanical system microphone sensor of claim 1,
wherein the differential amplifier is configured as an amplifier comprising single-ended output nodes or as an amplifier comprising digital output nodes.

6. The micro electro mechanical system microphone sensor of claim 1,
wherein the differential amplifier is configured to provide a first output signal at a first output node of the differential amplifier, wherein the first output signal is an inverted signal, and wherein the first output node of the differential amplifier is coupled to a first output terminal of the micro electro mechanical system interface circuit, and wherein the differential amplifier is configured to provide a second output signal at a second output node of the differential amplifier, wherein the second output signal is an non-inverted signal, and wherein the second output node of the differential amplifier is coupled to a second output terminal of the micro electro mechanical system interface circuit.

7. The micro electro mechanical system microphone sensor of claim 6, wherein the feedback control circuit comprises a signal adder comprising:
a first input node connected to the first output node of the differential amplifier, and
a second input node connected to the second output node of the differential amplifier, wherein the signal adder is configured to add the first and the second output signals of the differential amplifier and to provide a common mode signal at an output node of the signal adder in dependence of the sum of the first and the second output signals, and wherein the output node of the signal adder is coupled to the base terminal of the output filter of the bias voltage generator.

8. The micro electro mechanical system microphone sensor of claim 7, wherein the signal adder comprises a third input node configured to apply a reference signal, and wherein the signal adder is configured to provide the common mode signal at the output node of the signal adder in dependence on the difference of the reference signal from the sum of the first and the second output signal of the differential amplifier.

9. The micro electro mechanical system microphone sensor of claim 8, wherein the feedback control circuit comprises an amplifier being arranged between the output node of the signal adder and the base terminal of the output filter of the bias voltage generator.

10. The micro electro mechanical system microphone sensor of claim 6, wherein the feedback control circuit comprises a differential to signal ended amplifier comprising:
a first input node coupled to the first output node of the differential amplifier,
a second input node coupled to the second output node of the differential amplifier, and
an output node coupled to the base terminal of the output filter.

11. The micro electro mechanical system microphone sensor of claim 10, wherein the differential to single ended amplifier comprises a variable gain, the gain being set such that the differential to single ended amplifier is configured to generate the feedback signal at the base terminal of the output filter of the bias voltage generator so that the voltage potential at the base terminal of the output filter of the bias voltage generator is in a range of the voltage potential at the output node of the bias voltage generator.

12. The micro electro mechanical system microphone sensor of claim 10, wherein the feedback control circuit comprises a signal adder comprising a first input node and a second input node, the first input node being coupled to the first output node of the differential amplifier, and the second input node being coupled to the second output node of the differential amplifier, and wherein the signal adder is configured to generate a control signal to set the gain of the differential to single ended amplifier in dependence on the sum of the first and the second output signal of the differential amplifier.

13. The micro electro mechanical system microphone sensor of claim 1, wherein the feedback control circuit comprises a buffer circuit comprising an input node and an output node, the input node being connected to the at least one output node of the differential amplifier and the output node of the buffer circuit being connected to the base terminal of the output filter of the bias voltage generator.

* * * * *